United States Patent
Shin et al.

(10) Patent No.: US 7,888,749 B2
(45) Date of Patent: Feb. 15, 2011

(54) SEMICONDUCTOR DEVICES HAVING SELECTIVELY TENSILE STRESSED GATE ELECTRODES AND METHODS OF FABRICATING THE SAME

(75) Inventors: Dong-suk Shin, Gyeonggi-do (KR); Andrew Tae Kim, Gyeonggi-do (KR); Yong-kuk Jeong, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/752,370

(22) Filed: May 23, 2007

(65) Prior Publication Data

US 2008/0023769 A1      Jan. 31, 2008

(30) Foreign Application Priority Data

Jul. 31, 2006    (KR) .................... 10-2006-0072215

(51) Int. Cl.
*H01L 29/94*    (2006.01)
*H01L 21/336*    (2006.01)

(52) U.S. Cl. ....................................................... 257/397

(58) Field of Classification Search ................ 257/288, 257/E21.54, 446, 374, 506, 509, 524, 549, 257/E29.018, 501, 504, 505, 397; 438/151, 438/300

See application file for complete search history.

(56) References Cited

U.S. PATENT DOCUMENTS 7,422,950 B2 * 9/2008 Curello et al. .............. 438/300
2005/0079677 A1    4/2005 Ke et al.
2005/0093075 A1    5/2005 Bentum et al.
2005/0247926 A1 * 11/2005 Sun et al. ....................... 257/19
2006/0113568 A1 * 6/2006 Chan et al. ................... 257/204
2006/0121688 A1 * 6/2006 Ko et al. ....................... 438/439
2008/0081404 A1 * 4/2008 Barna et al. .................. 438/197

FOREIGN PATENT DOCUMENTS

KR    1020060004595 A    1/2006

* cited by examiner

*Primary Examiner*—Dao H Nguyen
*Assistant Examiner*—Tram H Nguyen
(74) *Attorney, Agent, or Firm*—Myers Bigel Sibley & Sajovec, P.A.

(57) ABSTRACT

A semiconductor device includes an active region. A gate electrode is disposed on the active region. An isolation region adjoins the active region, and is recessed with respect to a top surface of the active region underlying the gate electrode. The isolation region may be recessed a depth substantially equal to a height of the gate electrode. In some embodiments, the gate electrode is configured to support current flow through the active region along a first direction, and a tensile stress layer covers the gate electrode and is configured to apply a tensile stress to the gate electrode along a second direction perpendicular to the first direction. The tensile stress layer may cover the recessed isolation region and portions of the active region between the isolation region and the gate electrode. In further embodiments, an interlayer insulating film is disposed on the tensile stress layer and is configured to apply a tensile stress to the gate electrode along the second direction.

20 Claims, 11 Drawing Sheets

US 7,888,749 B2

SEMICONDUCTOR DEVICES HAVING SELECTIVELY TENSILE STRESSED GATE ELECTRODES AND METHODS OF FABRICATING THE SAME

CROSS REFERENCE TO RELATED APPLICATION

This application claims priority from Korean Patent Application No. 10-2006-0072215 filed on Jul. 31, 2006 in the Korean Intellectual Property Office, the disclosure of which is incorporated herein by reference in its entirety.

FIELD OF THE INVENTION

The present invention relates to semiconductor devices and methods of fabricating the same and, more particularly, to semiconductor devices with selectively mechanically stressed gate electrodes and methods of fabricating the same.

BACKGROUND OF THE INVENTION

Generally, a MOS field effect transistor (MOSFET) includes a gate insulating film which is formed on a semiconductor substrate, a gate electrode on the gate insulting film, and source/drain regions are formed at both sides of the gate electrode. In a typical MOSFET, a channel is formed in a channel region underlying the gate electrode as a bias voltage is applied.

As semiconductor devices have become highly integrated, channels have decreased in length. Therefore, methods have been developed in an effort to improve transistor performance.

Some techniques involve increasing the mobility of electrons or holes in the channel region. Specifically, if the mobility of the carriers increases, switching characteristics of a transistor may be improved, which may make it possible to manufacture a device having higher speed.

Some techniques involve changing the energy band structure of a channel region by applying physical stress. For example, when the semiconductor has a crystallographic orientation <100>, and the channel of an NMOS transistor has a crystallographic orientation <110>, if a tensile stress is applied in a channel direction, performance of an NMOS transistor may be improved. If a compressive stress is applied in the channel direction, performance of a PMOS transistor may be improved.

In contrast, if a tensile stress is applied in a transverse direction, that is, in a direction perpendicular to the channels of an NMOS or PMOS transistor, the mobility of a number of carriers may be increased, which may improve performance of the transistors.

Typically, an isolation region is formed around an NMOS or PMOS transistor. If the isolation region is formed of an HDP (High Density Plasma) oxide film, for example, it may be possible to decrease the mobility of a number of carriers of the NMOS and PMOS by applying a compressive stress in the transverse direction.

SUMMARY OF THE INVENTION

According to some embodiments of the present invention, a semiconductor device includes an active region. A gate electrode is disposed on the active region. An isolation region adjoins the active region, and is recessed with respect to a top surface of the active region underlying the gate electrode. The isolation region may be recessed a depth substantially equal to a height of the gate electrode. In some embodiments, the gate electrode is configured to support current flow through the active region along a first direction, and a tensile stress layer covers the gate electrode and is configured to apply a tensile stress to the gate electrode along a second direction perpendicular to the first direction. The tensile stress layer may also cover the recessed isolation region and portions of the active region between the isolation region and the gate electrode. In further embodiments, an interlayer insulating film is disposed on the tensile stress layer and is configured to apply a tensile stress to the gate electrode along the second direction.

In additional embodiments, a sidewall spacer is disposed on a sidewall of the gate electrode, and a top surface of the active region between the spacer and the isolation region is lower than the top surface of the active region underlying the gate electrode. The top surface of the isolation region may be lower than the top surface of the active region between the spacer and the isolation region.

Additional embodiments of the present invention provide methods of fabricating semiconductor devices. An isolation region is formed in a semiconductor substrate to define an active region in the semiconductor substrate. A gate electrode is formed on the active region. The isolation region is recessed with respect to a top surface of the active region underlying the gate electrode. The isolation region may be recessed to a depth substantially equal to a height of the gate electrode.

The gate electrode may be configured to support current flow through the active region along a first direction, and a tensile stress layer may be formed covering the gate electrode and configured to apply a tensile stress to the gate electrode along a second direction perpendicular to the first direction. An interlayer insulating film may be formed on the tensile stress layer, the interlayer insulating film configured to apply a tensile stress to the gate electrode along the second direction.

The isolation region may be formed by etching to recess the isolation region with respect to the top surface of the active region. A silicide layer may be formed on the active region between the isolation region and the gate electrode.

In some embodiments, a spacer is formed on a sidewall of the gate electrode and a portion of the active region between the spacer and the isolation region is etched using the spacer as an etching mask before etching to recess the isolation region, such that a top surface of the active region between the gate electrode and the isolation region is lower than the top surface of the active region underlying the gate electrode. A silicide layer may be formed on the recessed portion of the active region between the gate electrode and the isolation region.

DETAILED DESCRIPTION

Figure 1:
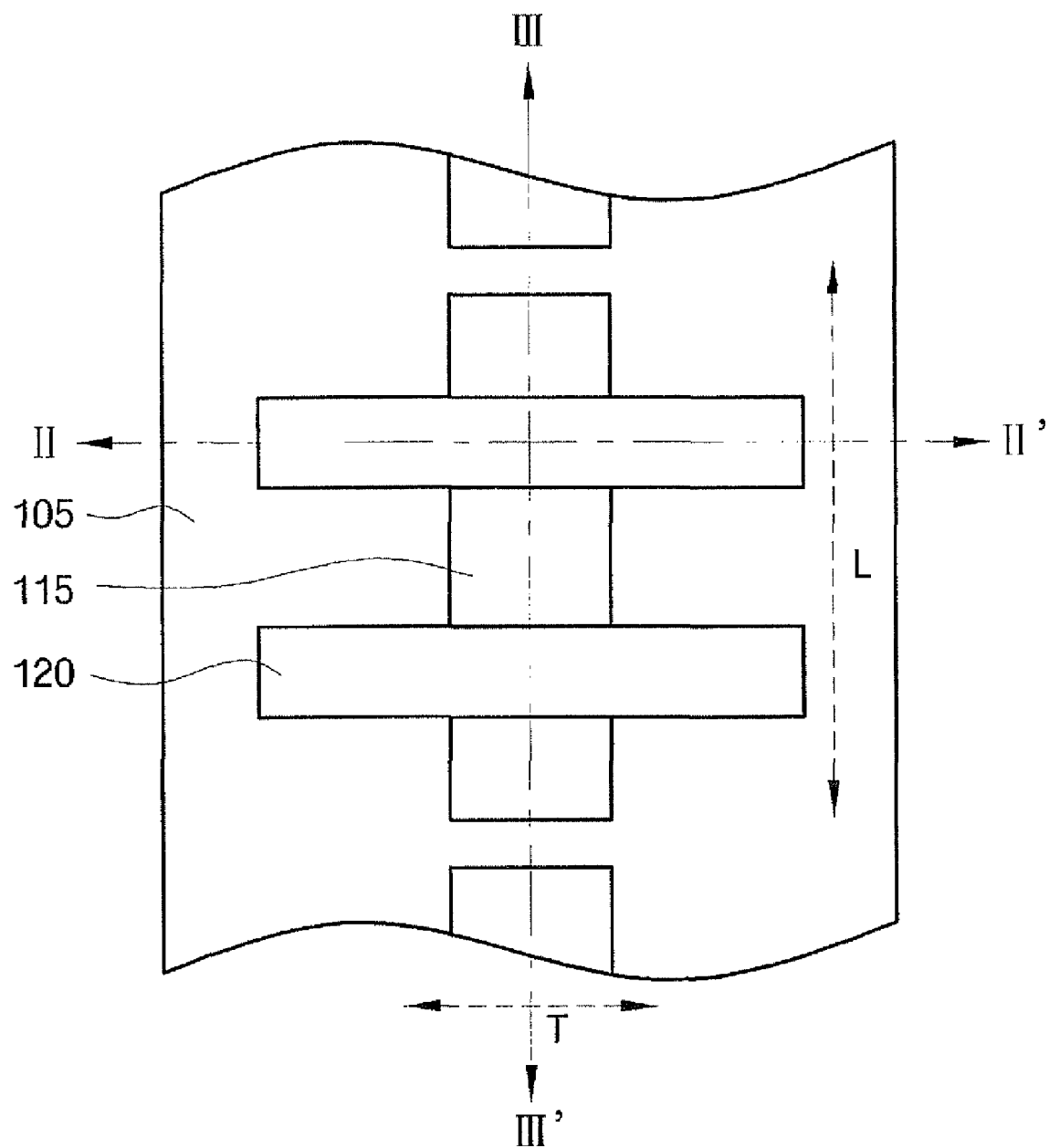
FIG. 1 is a plan view of a semiconductor device according to some embodiments of the invention.

The present invention will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments and is not intended to be limiting of the invention. As used herein, the singular forms "a", "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Embodiments of the present invention are described herein with reference to perspective illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

Hereinafter, some embodiments of the invention will be described in detail with reference to FIGS. 1 to 4.

Figure 2:
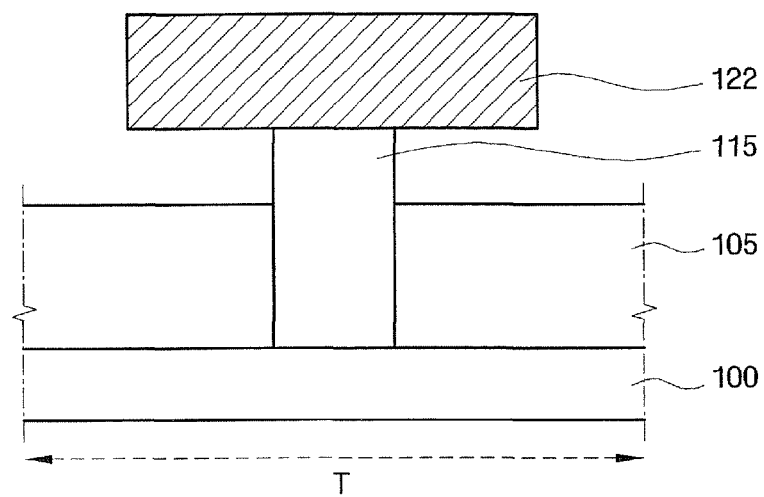
FIG. 2 is a cross-sectional view of the semiconductor device of FIG. 1, as taken along a line II-II' of FIG. 1.
Figure 3:
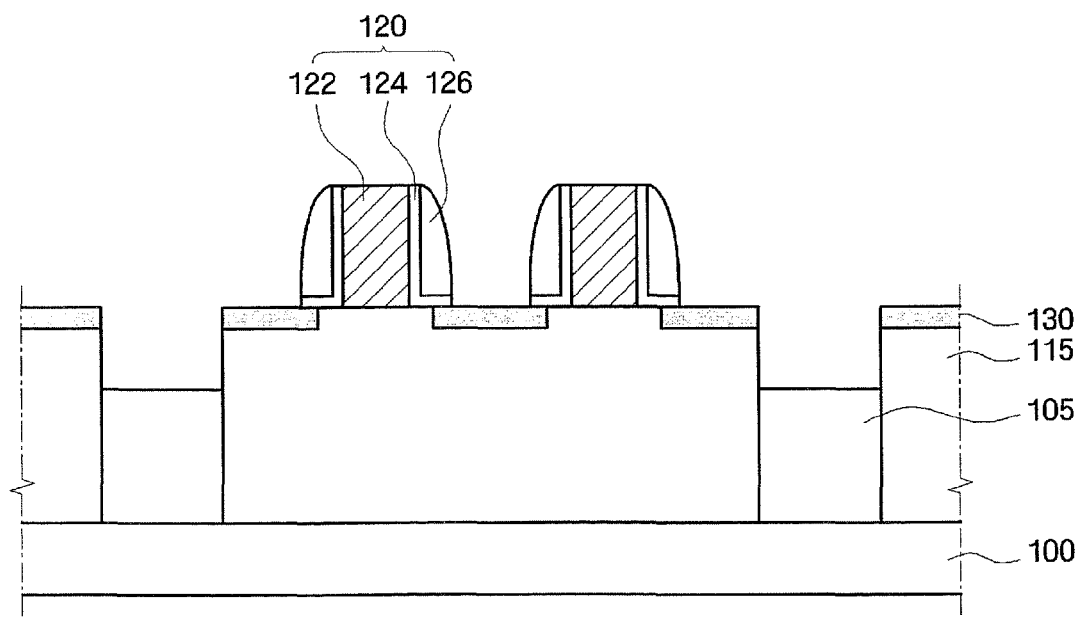
FIG. 3 is a cross-sectional view of the semiconductor device of FIG. 1, as taken along a line III-III' of FIG. 1.
Figure 4:
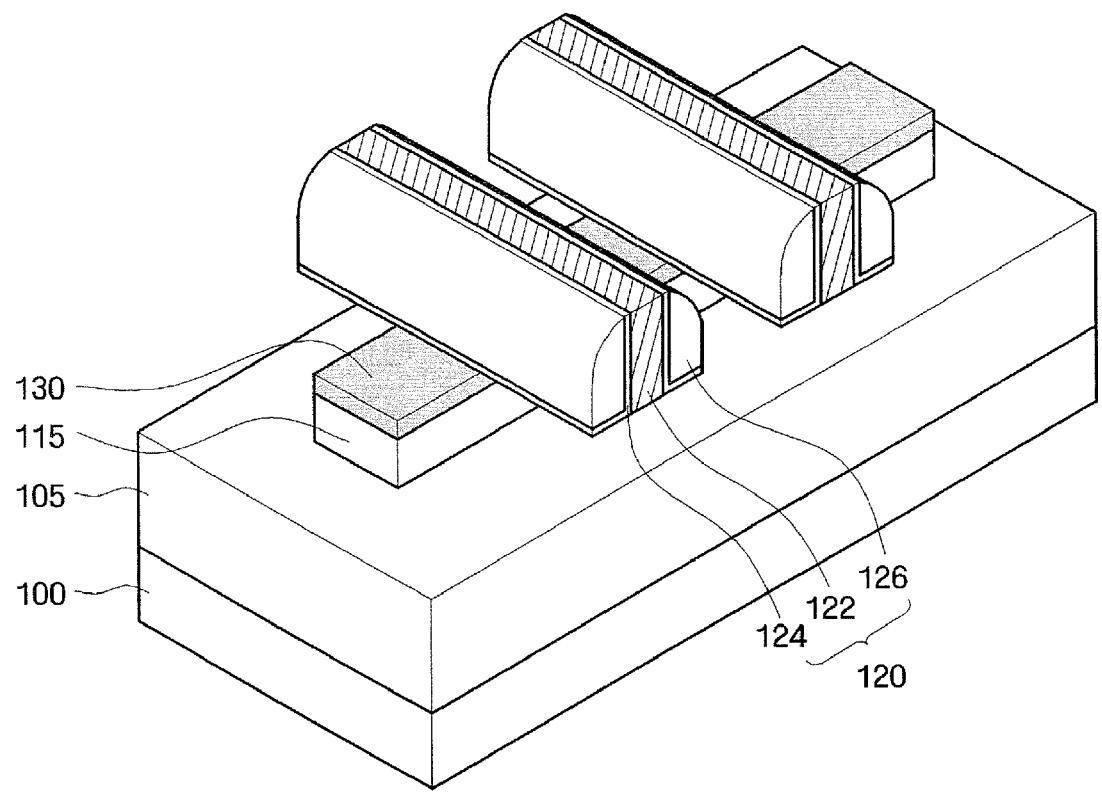
FIG. 4 is perspective view of the semiconductor device of FIGS. 1-3.

FIG. 1 illustrates a layout of a semiconductor device according to some embodiments of the invention. FIG. 2 is a cross-sectional view of the semiconductor device, taken along the line II-II' of FIG. 1. FIG. 3 is a cross-sectional view of the semiconductor device, taken along the line III-III' of FIG. 1. FIG. 4 is perspective view of FIG. 3. Here, an NMOS transistor in the case where the semiconductor substrate has a plane orientation (100) and the channel of a transistor has a lattice direction <110> is provided as an example.

Referring to FIGS. 1-3, an active region 115 is formed on a semiconductor substrate 100. The semiconductor substrate 100 may be, for example, a silicon substrate or an SOI (Silicon On Insulator) substrate or the like. A gate structure 120 is formed so as to overlap with the active region 115 and extends outside the active region 115. The gate structure 120 includes a gate electrode 122. Spacers 126 are formed at both sides of the gate electrode 122. An L-shaped insulating film 124 may be interposed between the gate electrode 122 and the spacer 126. The gate electrode 122 may include, for example, poly-Si, poly-SiGe or metal such as Ta, TaN, TaSiN, TiN, Mo, Ru, Ni, and NiSi or mixtures thereof. The insulating film 124 is formed in an L shape, and may include, for example, a thermally-oxidized film or a TEOS (Tetra Ethyl Ortho Sillicate) film. The spacer 126 may include, for example, a nitride film or an oxide film.

A silicide film 130 is formed on the active region 115 at portions thereof not covered by the gate structure 120. The silicide film 130 is formed to decrease interface resistance between a silicon substance of the active region 115 and a metal film obtained in a subsequent process. An element isolation region 105 is formed so as to have a top surface that is lower than the active region 115. That is, the element isolation region 105, which defines the active region 115, is recessed so as to have a top surface that is lower than a top surface of the active region 115 overlapping with the gate structure 120, and is formed so as not to be in contact with the gate structure 120. The recessed depth of the element isolation region 105 is substantially equal to the height of the gate structure 120. However, the recessed depth can be adjusted to the extent needed to ensure a decrease in compressive stress on the gate structure 120.

To be more specific, as described above, the element isolation region 105 is recessed so as to have the top surface lower than the top surface of the active region 115 overlapping the gate structure 120. As a result, the gate structure 120 is not in contact with the element isolation region 105. Source and drain regions are formed on the active region 115, and currents flow in a direction from drain to source.

As shown in FIG. 1, a direction parallel to a direction in which currents flow is indicated by L (longitudinal), and a direction perpendicular to the direction in which currents flow is indicated by T (transverse; hereinafter, referred to as 'T direction'). In this case, in the case of an NMOS transistor, if a tensile stress is applied in the T direction, an operating current of the NMOS transistor may be improved, thus improving performance.

As described above, according to the illustrated embodiments of the invention, the element isolation region 105 is recessed so as to have the top surface lower than the top surface of the active region 115 overlapping the gate structure 120. As a result, the element isolation region 105 on which a compressive stress is applied is not in contact with the gate structure 120, which may decrease a compressive stress applied in T direction to the active region.

Figure 5:
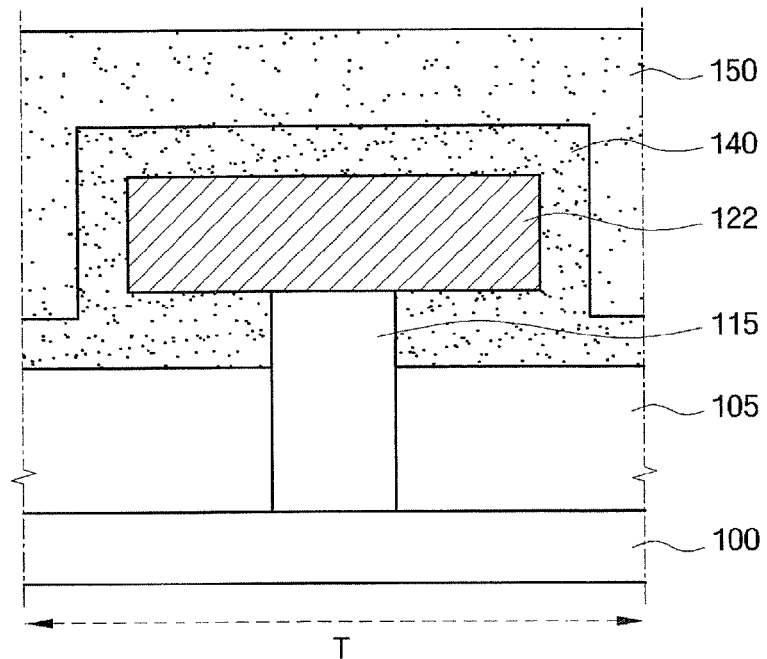
FIG. 5 is a cross-sectional view of a semiconductor device according to further embodiments of the invention, taken along a length direction of a gate electrode.
Figure 6:
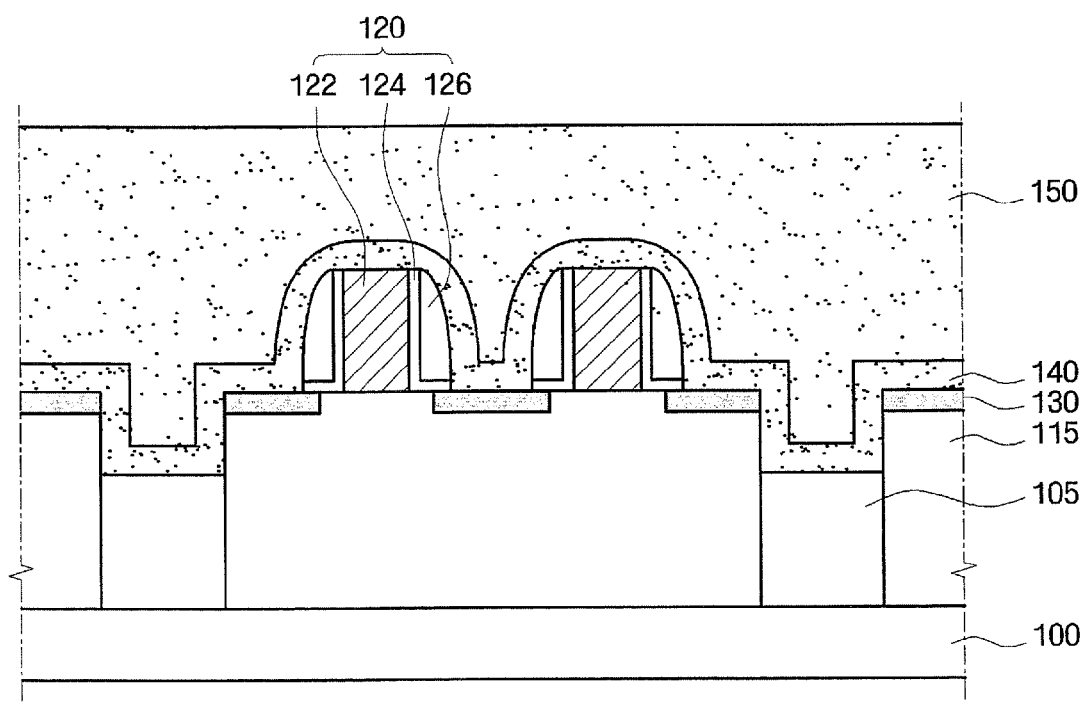
FIG. 6 is a cross-sectional view of the semiconductor device of FIG. 5, taken along a length direction of an active region of FIG. 5.

A semiconductor device according to further embodiments of the invention will be described with reference to FIGS. 5 and 6. FIG. 5 is a cross-sectional view of the semiconductor device, as taken along the length direction of a gate electrode 122. FIG. 6 is a cross-sectional view of the semiconductor device, as taken along the length direction of an active region 115.

Referring to FIG. 5, like reference numerals refer to like elements in FIGS. 2 and 5, and further description thereof will be omitted in light of the foregoing description of FIG. 2. As shown, the embodiments of FIG. 5 differ in that a tensile stress film 140 is formed to surround the top surface, side surfaces, and bottom surface that is not overlapping with the active region 115, of the gate electrode 122. Additionally, an interlayer insulating film 150 having a tensile stress is formed on the tensile stress film 140. Thus, it is possible to obtain a semiconductor device capable of applying more tensile stress, while decreasing conditions applying a compressive stress directly on the gate electrode 122 or the gate structure 120.

The tensile stress film 140 may be formed of any one of SiN, SiO2, SiCN, SiON, etc. The tensile stress film 140 may be formed using a thermal process of LPCVD (Low Pressure Chemical Vapor Deposition) so as to have a tensile force; otherwise, it can be formed by a PECVD (Plasma Enhanced Chemical Vapor Deposition) process using plasma. In this case, the thickness of the tensile stress film 140 may be in the range of 30 to 100 nm. Particularly, because the tensile stress film 140 of the invention can increase a tensile stress of the gate structure 120, performance of the transistor can be further improved.

If a tensile stress is applied in the direction perpendicular to the direction in which currents of the active region 115 flow, that is, in T direction, an energy band of majority carrier is split. Here, electrons having different effective mass are concentrated in each split energy band, and scattering becomes more active, whereby mobility of the electrons can increase. Increase in mobility of the electrons can improve the performance of the NMOS transistor. Accordingly, it is possible to increase mobility of the electrons, thus improving operating currents of the NMOS transistor. In the illustrated embodiments, even though the NMOS is taken as an example for convenience, the invention is not limited thereto. In the case of the PMOS transistor, if a tensile stress is applied in the T direction, an energy band of holes, that is, energy band of majority carrier is split. Similar to the case of the NMOS, holes having different effective mass are concentrated in each of the split energy bands, and scattering becomes more active. Thus, it is possible to increase mobility of the holes, thereby improving operation currents of the transistor. The tensile stress film 140 may be used as an etching stop liner film with respect to metal contact.

Continuing with FIG. 5, an interlayer insulating film 150 having a tensile stress is formed on the tensile stress film 140. Because the interlayer insulating film 150 is formed of material having a tensile stress, performance of the transistor of the semiconductor device can be further improved. Here, the interlayer insulating film 150 may be, for example, a PMD (Pre-Metal Dielectric) film.

In some embodiments of the invention, to increase tensile stress, the interlayer insulating film 150 having tensile stress is formed on the tensile stress film 140, but this is not limitative. In some embodiments, a conventional metal contact etching stop liner thin film may be formed to surround the top surface, side surfaces, and bottom surface which is not overlapping the active region 115, of the gate electrode 122. Additionally, the interlayer insulating film 150 having tensile stress may be formed on the tensile stress film 140. Even though the interlayer insulating film 150 having a tensile stress is formed on a conventional etching stop film, tensile stress in the T direction can be increased, thus improving performance.

Figure 7:
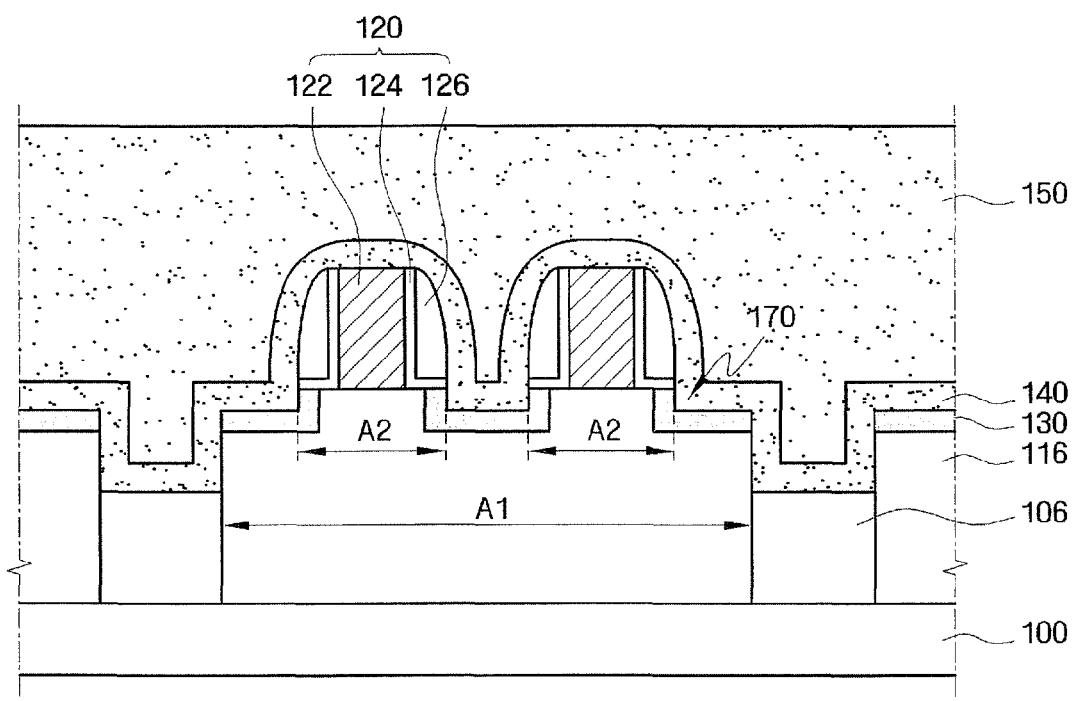
FIG. 7 is a cross-sectional view of a semiconductor device according to additional embodiments of the invention, taken along a length direction of an active region.
Figure 8:
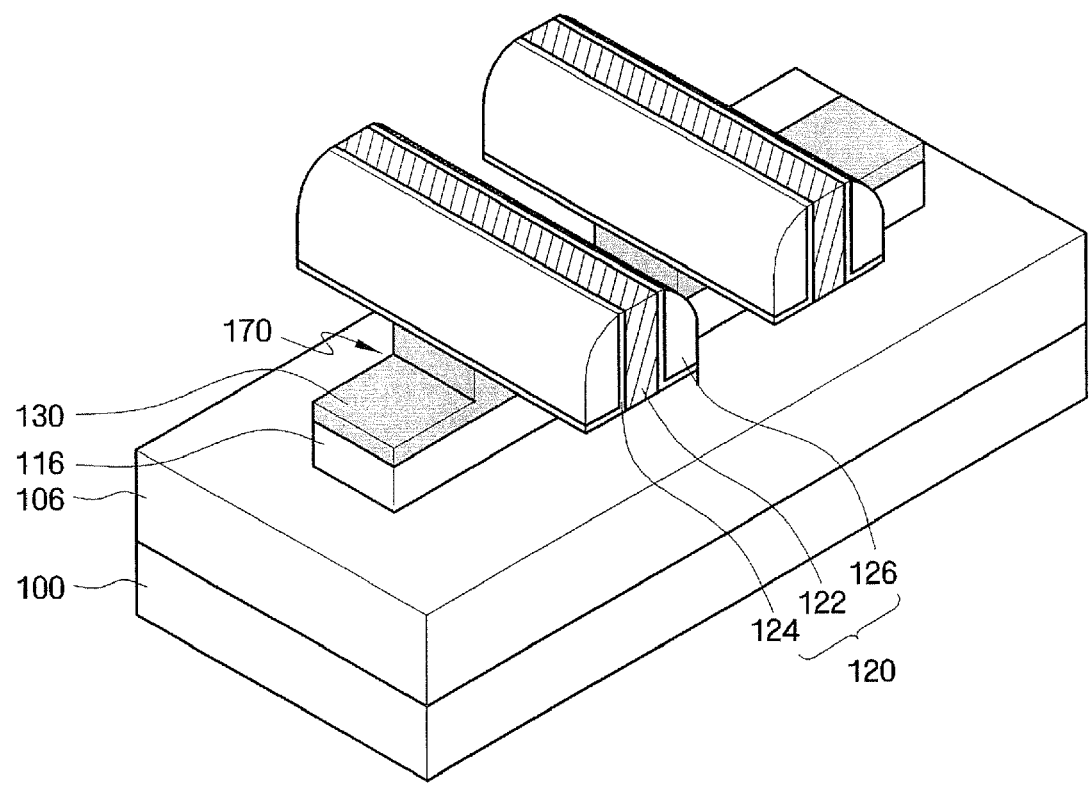
FIG. 8 is perspective view of the semiconductor device of FIG. 7.

Additional embodiments of the invention will now be described with reference to FIGS. 7 and 8. FIG. 7 is a cross-sectional view taken along a length direction of an active region.

Referring to FIG. 7, these embodiments differ from the previously described embodiments in that the top surface of an active region 116 located outside the spacer 126 is lower than the top surface of the active region 116 located at the bottom surface of the gate electrode 122 and the spacer 126. In other words, according to the illustrated embodiments, not only a recessed region of an element isolation region 106 is formed, but also a recessed region 170 is formed at a portion of the active region 116. Moreover, the element isolation region 106 is formed so as to have the top surface that is lower than the recessed region 170 of the active region 116. To be more specific, the top surface of the active region 116 is not uniform, but partially has recessed regions. Therefore, a transistor having a relatively small effective channel length may be formed, so that stress can be increased. In other words, it is possible to increase a tensile stress applied to the gate stricture 120 by structurally applying stress on the gate structure 120.

How the partially recessed active region 170 increases a structural stress of the gate structure 120 will be described in detail. If the active region 116 has substantially a uniform top surface, the total channel obtained by adding all channels of the continuous gate structure 120 may become the effective channel of the gate structure 120 to which the tensile stress film 140 can apply stress. Therefore, if the active region 116 is formed to have a uniform top surface, even when one gate stricture 120 is present, an effective channel length to which the tensile stress film 140 can apply stress is considered as A1.

However, if the recessed active region 170 is formed, even when the gate structure 120 is continuously formed, the effective channel cannot be continuous to the tensile stress film 140 because of the recessed structure of the active region 116. Therefore, an actual effective channel length of the gate structure 120 is A2. This means that strength applying stress per unit area or length is increased to increase a tensile stress to be applied by reducing the effective channel length to which the stress film can apply stress.

Hereinafter, methods of fabricating the semiconductor device of FIGS. 1-4 will be described with reference to FIGS.

Figure 9:
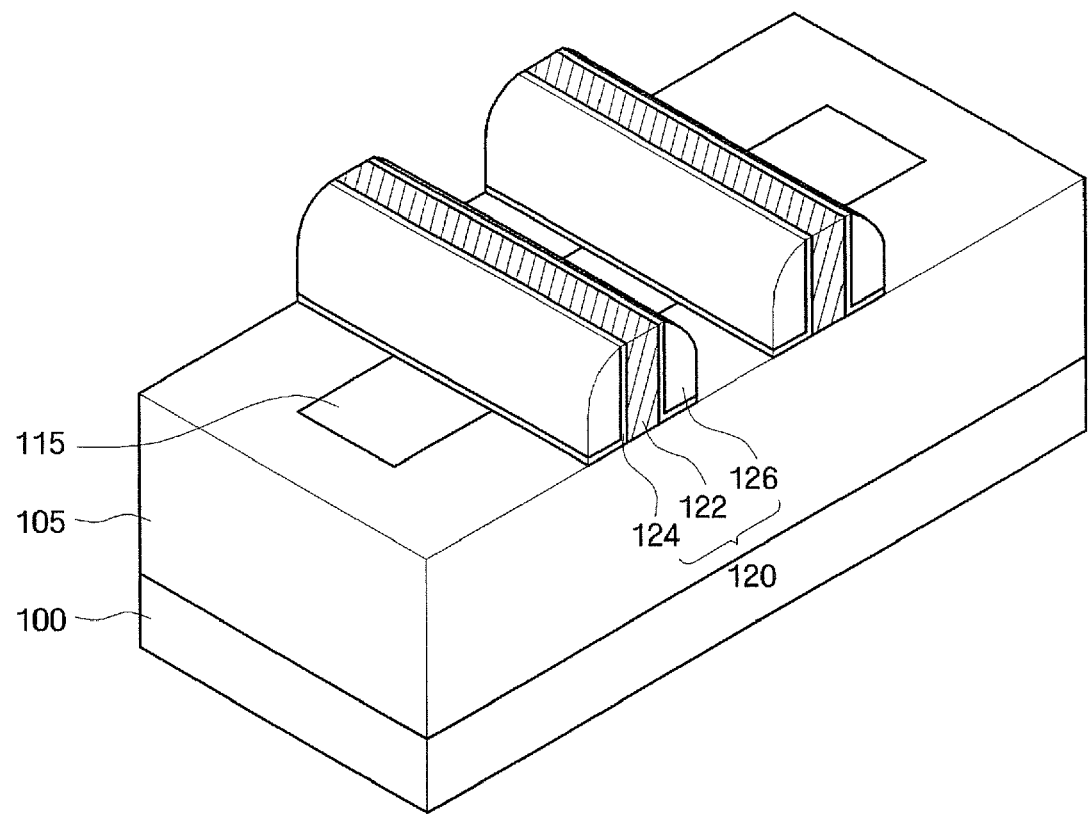
FIGS. 9 to 10 are perspective views illustrating intermediate fabrication products for the semiconductor device of FIGS. 7-8 according to some embodiments of the invention.
Figure 10:
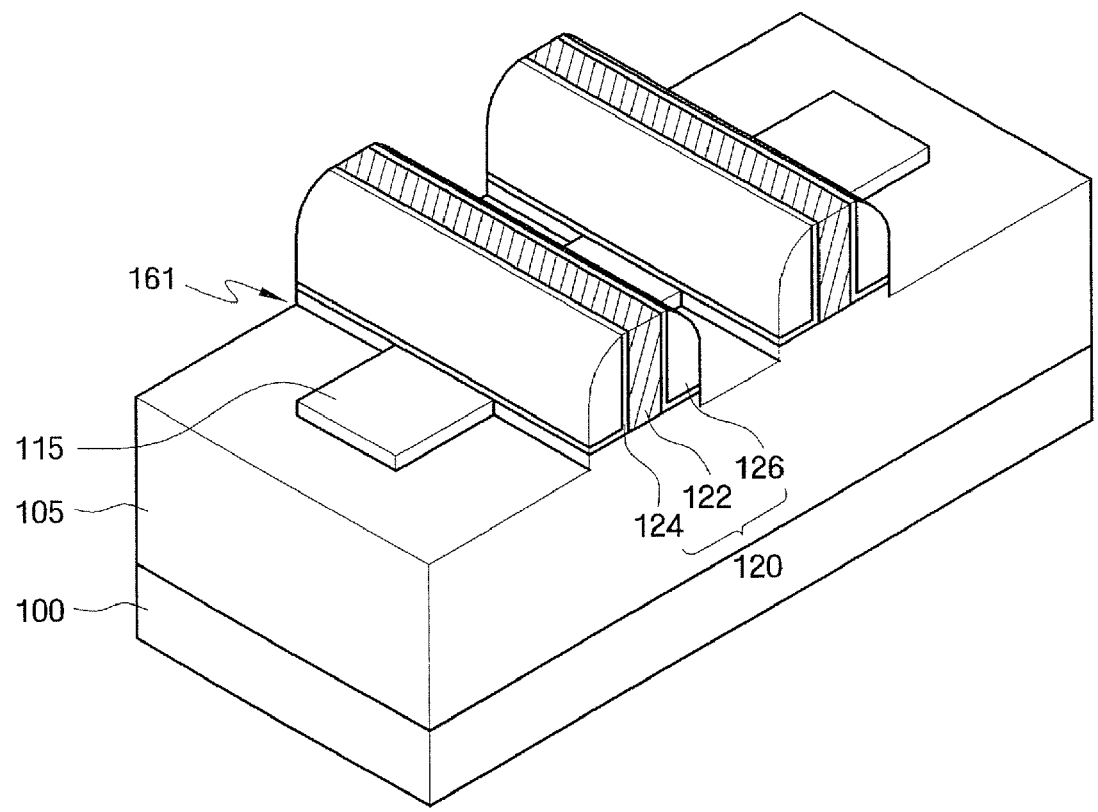

4, 9, and 10. FIGS. 9 and 10 are perspective views illustrating intermediate fabrication products according to some embodiments of the invention.

Referring to FIG. 9, the gate structure 120 is formed on the semiconductor substrate 100 in which the active region 115 is defined by the element isolation region 105. The semiconductor substrate 100 may be a silicon substrate or an SOI substrate. A predetermined region of the semiconductor substrate 100 is etched to form a trench, and insulating material is embedded in the trench to form the element isolation region 105. The element isolation region 105 is formed by depositing an HDP (High Density Plasma) oxide film. Here, the thickness of the element isolation region 105 is in the range of 1000 to 7000 Å.

The gate structure 120 is formed so as to overlap with the active region 115 that is defined by the element isolation region 105 and extend outside the active region 115. A gate insulating film and a gate conductive film is deposited on the semiconductor substrate 100 and patterned to form the gate structure 120. To be more specific, as for the gate structure 120, the gate electrode 122 may include poly-Si, poly-SiGe or metal such as Ta, TaN, TaSiN, TiN, Mo, Ru, Ni, and NiSi or mixtures thereof. Here, the thickness of the gate structure 120 may be in the range of 100 to 200 nm. An insulating film 124 is formed in an L shape at both side surfaces of the gate electrode 122. The insulating film 124 may include a thermal oxide film or a TEOS film, and is formed with a thickness in the range of 10 to 30 nm. The spacer 126 may include a nitride film or an oxide film, and formed at the side surface of the insulating film 124 with a thickness in the range of 30 to 60 nm. A photo resist pattern is formed to expose an NMOS transistor region. Source and drain regions are formed on the active region 115.

Referring to FIG. 10, a predetermined region of the element isolation region 105 is etched to form a partial recess 161. To be more specific, pre-cleaning is performed before the following process of forming a silicide film. While the pre-cleaning is performed by using HF solution, the element isolation region 105 is partially etched to form the partial recess 161. That is, the element isolation region 105 located adjacent to the gate structure 120 is etched to form the recess, by using either isotropic or anisotropic dry etching, or a mixture thereof, or an isotropic wet etching. The partially formed recess is subsequently used to define a silicide film. Returning to FIG. 4, the element isolation region 105 is further etched, such that the element isolation region 105 is not in contact with the gate structure 120. To be more specific, the silicide film 130 is formed on the above-described result structure. To form the silicide film 130, a silicide metal film is deposited on the entire surface of the semiconductor substrate 100 of the result structure. A silicide metal film is formed on the active region 115 that is exposed by the gate structure 120. The silicide metal film is diffused into the active region 115 by performing a thermal treatment on the silicide metal film afterward, so as to form the silicide film 130. By forming the silicide film 130, it is possible to prevent interface resistance from increasing when metal substance of the metal film in the following process is in contact with silicon substance of the active region 115. Subsequently, the element isolation region 105 to which a compressive stress can be applied is further etched so as to be formed to have the top surface lower than the top surface of the active reaction, which does not overlap with the gate structure 120.

By performing either isotropic or anisotropic dry etching, or a mixture thereof, the element isolation region 105 located at the bottom of the gate structure 120 where the gate structure 120 does not overlap with the active region 115 is etched. While an isotropic wet etching can be used, an isotropic dry etching can be used by using RIE (Reactive Ion Etch). For example, etching may be performed not only in a vertical direction but also in a horizontal direction by using an isotropic wet etching.

Therefore, the element isolation region 105 located below the bottom surface of the gate structure 120 can also be etched. At this time, the recess has a depth in the range of 100 to 200 nm that is substantially equal to the height of the gate structure 120. Preferably, the depth of the recess is in the range of 100 to 150 nm.

Accordingly, as a predetermined portion of the compressive stress film is removed in the length direction of the gate structure 120, that is, in T direction (not shown), a compressive stress can be decreased.

In methods of fabricating the semiconductor device of FIGS. 5 and 6, the tensile stress film 140 is formed on the above-described result structure. The tensile stress film 140 maybe formed by using a PECVD or LPCVD process at the temperature in range of 300 to 600° C. The tensile stress film 140 may be formed to have a thickness in the range of 30 to 100 nm, for example. Subsequently, the interlayer insulating film 150 having a tensile stress is formed on the tensile stress film 140.

Figure 11:
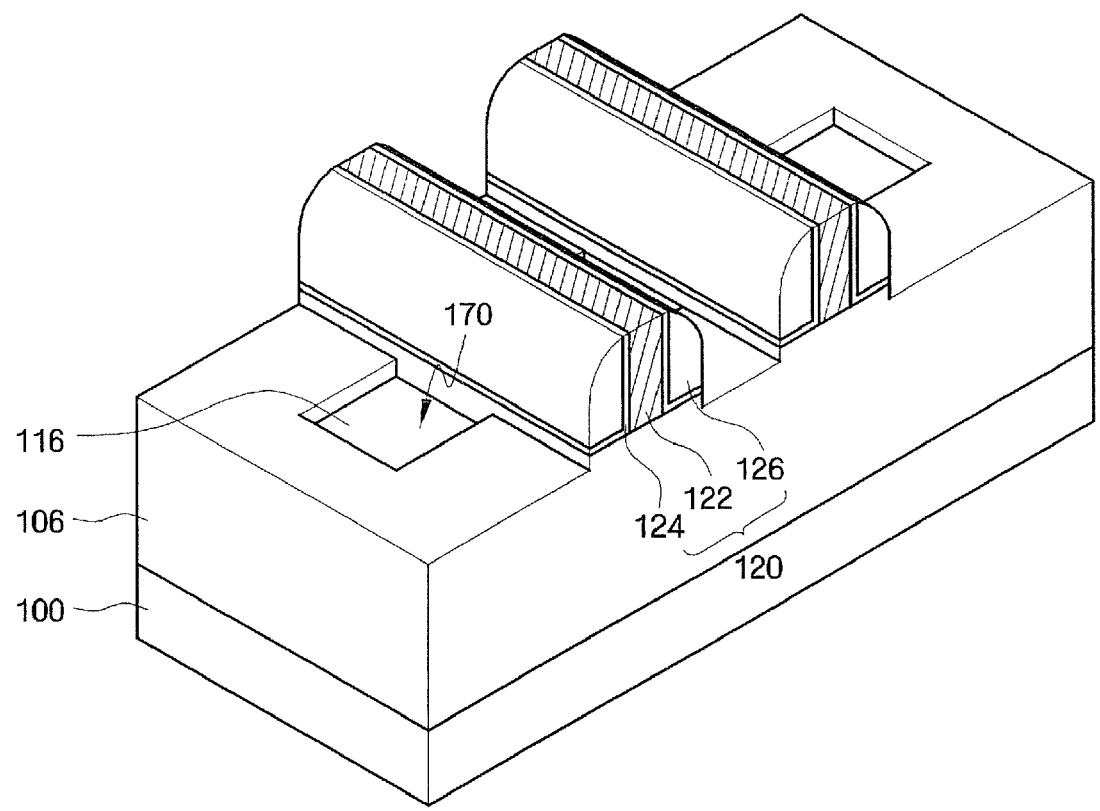
FIG. 11 is perspective view illustrating an intermediate fabrication product for the semiconductor device of FIGS. 7-8 according to further embodiments of the invention.

The above-described structure can be formed by using a deposition process using a thermal process of O3-TEOS, PE-TEOS or mixture thereof. Thus, a semiconductor device in which more tensile stress is applied can be obtained. Methods of fabricating the semiconductor device of FIGS. 7 and will now be described with reference to FIG. 11. FIG. 11 is a perspective view illustrating an intermediate fabrication product. As described in the other method embodiments of the invention, a pre-cleaning is performed using HF solution before the silicidation process. The recess of the element isolation region 106 is partially formed to clearly define a silicide region.

In this case, the active region 116 is partially etched to form the recessed region 170. To be more specific, by using the spacer 126 of the gate structure 120 as an etching mask, a portion of the active region 116 outside the spacer 126 is etched. Accordingly, the top surface of the active region located outside the spacer 126 is lower than the top surface of the active region 116 located at the bottom surface of the gate structure 120. In other words, returning to FIG. 8, the recessed element isolation region 106 is formed at the bottom surface of the gate structure 120 where the gate structure 120 does not overlap with the active region 116 so as to have the top surface lower than the recessed region 170 of the active region. The silicide film 130 is formed along the recessed region 170 of the active region 116. Thus, it is possible to increase the tensile stress film to be applied on the channel by changing an outside structure of the gate stricture 120.

Figure 12:
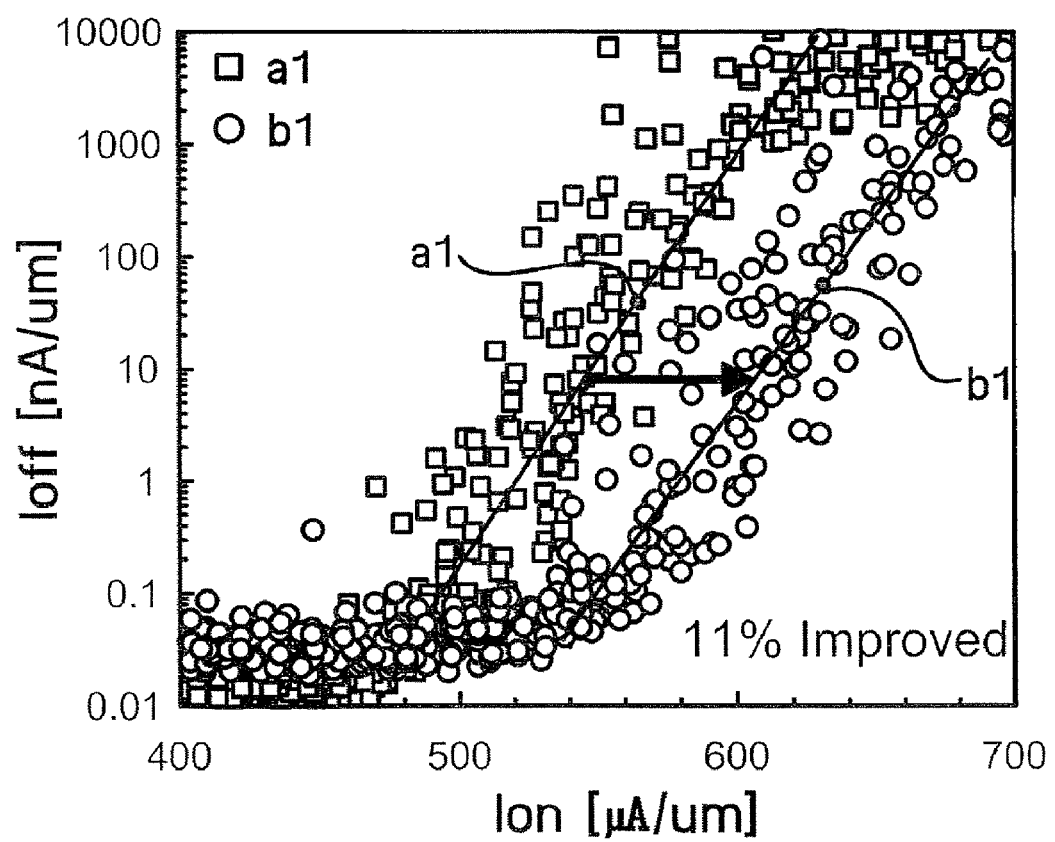
FIGS. 12 and 13 are simulation graphs illustrating operations of semiconductor devices according to some embodiments of the present invention.
Figure 13:
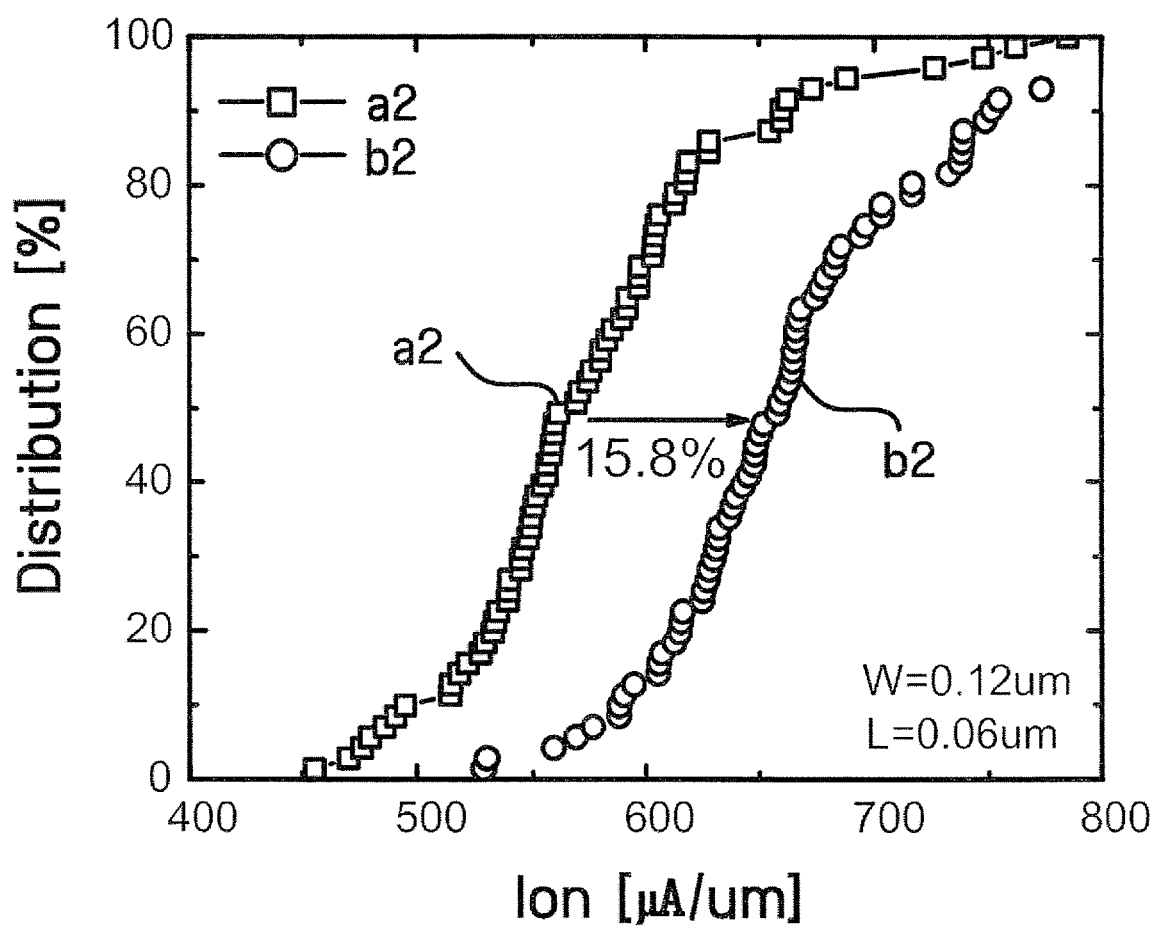

FIGS. 12 and 13 are simulation graphs illustrating potential performance of devices according to some embodiments of the present invention.

EXPERIMENT 1

FIG. 12 shows the case in which currents of the NMOS transistor according to some embodiments of the invention compared to a conventional transistor. First, as for a1, the width of the active region that is defined by the element isolation region is set to 2 μm, and the NMOS gate electrode is formed so as to overlap with the active region and extend to the outside of the active region.

As for b1, the width of the active region is set to 2 μm, and similarly, the NMOS gate electrode is formed so as to overlap with the active region and extend to the outside of the active region. In addition, the recessed element isolation region is formed so as to have the top surface lower than the top surface of the active region that does not overlap with the NMOS gate electrode. In this case, the depth of the recession is set to 20 nm so as to be substantially equal to the height of the gate electrode.

a1 indicates the case of forming a conventional transistor, and b1 indicates the case of forming the recessed element isolation region having the top surface lower than the top surface of the active region that does not overlap with the gate electrode, as shown in the invention.

In FIG. 12, x-axis indicates the on-current, and y-axis indicates the off-current. In this case, with respect to 10 nA that is the median of the y-axis, improvement of currents are shown. As shown in FIG. 12, the current of the NMOS transistor of a1 is 540 uA, but the current of the NMOS transistor of b1 is about 610 uA. Accordingly, the operating current of the NMOS transistor of the invention has improved 11%, as compared to the conventional one. In the conventional NMOS transistor, the element isolation region applies a compressive stress in T direction of the gate electrode.

However, in the NMOS transistor of the invention, the element isolation region is recessed so as to have the top surface lower than the top surface of the active region that does not overlap with the gate electrode, thus decreasing conditions applying a compressive stress, which can improve currents. Therefore, performance has improved in the embodiment of the invention, as compared to the related art.

EXPERIMENT 2

FIG. 13 is a distribution diagram showing currents of conventional NMOS transistors a2 in comparison to transistors according to some embodiments of the invention b2.

As for a2, the active region is formed to have the thickness of 0.12 μm, and the NMOS gate electrode is formed to have the length of 0.06 μm. As described above, a NMOS transistor is formed by a conventional method.

As for b2, the active region is formed to have the width of 0.12 μm, and the NMOS gate electrode is formed to have the length of 0.06 μm. As described in FIG. 12, the element isolation region is recessed so as to have the top surface lower than the top surface of the active region that does not overlap with the gate electrode. Here, x-axis indicates the on-current, and y-axis indicates distribution of currents.

With respect to distribution 50% that is the median of y-axis, the on-current distribution of the conventional NMOS transistor is 550 uA on average. However, the on-current distribution of the NMOS transistor of the invention is 650 uA, which means that the current has improved 15.8%, as compared to the related art.

As described above, according to the embodiment of the invention, since the element isolation region is recessed by etching to have the top surface lower than the top surface of the active region that does not overlap with the gate electrode, it is possible to decrease a compressive stress in the T direction, that is, in the length direction of the gate structure 120. Therefore, it is possible to improve current speed of the semiconductor device by improving mobility of a number of carriers of the transistor.

In some embodiments, an element isolation region which can apply a compressive stress in the length direction of a gate electrode may be etched to form a recess so as to have the top surface lower than the top surface of the active region that does not overlap with the gate electrode, making it possible to decrease a compressive stress in the length direction of the gate electrode. The recessed region and the top surface of the gate electrode may be surrounded by the tensile stress film, making it possible to increase a tensile stress in the length direction of the gate electrode. Thus, mobility of majority carriers of the transistor can be increased, which can improves operating current. In embodiments in which the active region is partially etched to form a recession, the transistor formed may have a relatively small channel length. This makes it possible to further increase applied stress.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A semiconductor device comprising:
   an active region;
   a gate electrode on the active region; and
   an isolation region adjoining a sidewall of the active region, the isolation region recessed with respect to a top surface of the active region underlying the gate electrode, wherein a top surface of a portion of the isolation region positioned below and overlapped by the gate electrode is lower than the top surface of the active region underlying the gate electrode.

2. The semiconductor device of claim 1, wherein the gate electrode is configured to support current flow through the active region along a first direction, and further comprising a tensile stress layer covering the gate electrode and configured to apply a tensile stress to the gate electrode along a second direction perpendicular to the first direction.

3. The semiconductor device of claim 2, wherein the tensile stress layer covers the recessed isolation region and portions of the active region between the isolation region and the gate electrode.

4. The semiconductor device of claim 2, further comprising an interlayer insulating film on the tensile stress layer, the interlayer insulating film configured to apply a tensile stress to the gate electrode along the second direction.

5. The semiconductor device of claim 1, further comprising:
   an etching stop film surrounding the gate electrode; and
   an interlayer insulating film formed on the etching stop film, the interlayer insulating film having a tensile stress.

6. The semiconductor device of claim 1, wherein the isolation region is recessed a depth substantially equal to a height of the gate electrode.

7. The semiconductor device of claim 1, further comprising a sidewall spacer disposed on a sidewall of the gate electrode, wherein a top surface of the active region between the spacer and the isolation region is lower than the top surface of the active region underlying the gate electrode.

8. The semiconductor device of claim 7, wherein the top surface of the isolation region is lower than the top surface of the active region between the spacer and the isolation region.

9. A method of fabricating a semiconductor device, the method comprising:
   forming a isolation region in a semiconductor substrate to define an active region in the semiconductor substrate, the isolation region adjoining a sidewall of the active region; and
   forming a gate electrode on the active region,
   wherein the isolation region is recessed with respect to a top surface of the active region underlying the gate electrode, and wherein a top surface of a portion of the isolation region positioned below and overlapped by the gate electrode is lower than the top surface of the active region underlying the gate electrode.

10. The method of claim 9, wherein the gate electrode is configured to support current flow through the active region along a first direction, and wherein the method further comprises forming a tensile stress layer covering the gate electrode and configured to apply a tensile stress to the gate electrode along a second direction perpendicular to the first direction.

11. The method of claim 10, wherein the tensile stress layer covers the recessed isolation region and portions of the active region between the isolation region and the gate electrode.

12. The method of claim 10, further comprising forming an interlayer insulating film on the tensile stress layer, the interlayer insulating film configured to apply a tensile stress to the gate electrode along the second direction.

13. The method of claim 10, wherein the tensile stress layer is formed by an LPCVD or PECVD process.

14. The method of claim 10, further comprising:
forming an etching stop film surrounding the gate electrode; and
forming an interlayer insulating film on the etching stop film, the interlayer insulating film having a tensile stress.

15. The method of claim 9, wherein the isolation region is recessed to a depth substantially equal to a height of the gate electrode.

16. The method of claim 9, wherein forming an isolation region in the semiconductor substrate to define an active region in the semiconductor substrate comprises etching to recess the isolation region with respect to the top surface of the active region.

17. The method of claim 16, further comprising forming a silicide layer on the active region between the isolation region and the gate electrode after etching the isolation region.

18. The method of claim 16, further comprising forming a spacer on a sidewall of the gate electrode and etching a portion of the active region between the spacer and the isolation region using the spacer as an etching mask before etching to recess the isolation region, such that a top surface of the active region between the gate electrode and the isolation region is lower than the top surface of the active region underlying the gate electrode.

19. The method of claim 18, further comprising forming a silicide layer on the recessed portion of the active region between the gate electrode and the isolation region.

20. The method of claim 18, wherein the top surface of the isolation region is lower than the top surface of the active region between the gate electrode and the isolation region.

* * * * *